(12) United States Patent
Park et al.

(10) Patent No.: US 10,930,613 B2
(45) Date of Patent: Feb. 23, 2021

(54) SEMICONDUCTOR PACKAGE HAVING RECESSED ADHESIVE LAYER BETWEEN STACKED CHIPS

(71) Applicant: Samsung Electronics Co., Ltd., Suwon-si (KR)

(72) Inventors: Sang Sick Park, Hwaseong-si (KR); Un Byoung Kang, Hwaseong-si (KR); Tae Hong Min, Hwaseong-si (KR); Teak Hoon Lee, Daejeon (KR); Ji Hwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/438,505

(22) Filed: Jun. 12, 2019

(65) Prior Publication Data

US 2020/0098719 A1 Mar. 26, 2020

(30) Foreign Application Priority Data

Sep. 21, 2018 (KR) .......................... 10-2018-0114330

(51) Int. Cl.
*H01L 23/31* (2006.01)
*H01L 23/00* (2006.01)
(Continued)

(52) U.S. Cl.
CPC ............ *H01L 24/32* (2013.01); *H01L 21/561* (2013.01); *H01L 23/3114* (2013.01); *H01L 23/3128* (2013.01); *H01L 23/3135* (2013.01); *H01L 23/3185* (2013.01); *H01L 23/3192* (2013.01); *H01L 24/16* (2013.01); *H01L 24/17* (2013.01); *H01L 24/33* (2013.01); *H01L 24/73* (2013.01);
(Continued)

(58) Field of Classification Search
CPC ............. H01L 23/3107; H01L 23/3114; H01L 23/3121; H01L 23/3128; H01L 23/3135; H01L 23/3157; H01L 23/3178; H01L 23/3185; H01L 23/3192; H01L 24/32; H01L 2224/32057; H01L 2224/32058; H01L 2224/32059; H01L 2224/32145; H01L 25/0657; H01L 25/073; H01L 25/074; H01L 2225/06541
See application file for complete search history.

(56) References Cited

U.S. PATENT DOCUMENTS 8,093,104 B1 1/2012 Lee et al.
8,436,479 B2 3/2013 Sasaki
(Continued)

FOREIGN PATENT DOCUMENTS

JP 2007-115924 A 5/2007
JP 2010-263200 A 11/2010
(Continued)

*Primary Examiner* — Stephen W Smoot
(74) *Attorney, Agent, or Firm* — Muir Patent Law, PLLC

(57) ABSTRACT

A semiconductor package includes a first semiconductor chip having a first through substrate via (TSV), a second semiconductor chip stacked on the first semiconductor chip and a first adhesive layer disposed between the first semiconductor chip and the second semiconductor chip. The second semiconductor chip includes a second through substrate via connected to the first through substrate via. A side surface of the first adhesive layer is recessed from side surfaces of the first and second semiconductor chips.

17 Claims, 11 Drawing Sheets

(51) Int. Cl.
  *H01L 25/18* (2006.01)
  *H01L 21/56* (2006.01)
  *H01L 25/00* (2006.01)
  *H01L 25/065* (2006.01)

(52) U.S. Cl.
  CPC .......... *H01L 24/83* (2013.01); *H01L 25/0657* (2013.01); *H01L 25/18* (2013.01); *H01L 25/50* (2013.01); *H01L 2224/16145* (2013.01); *H01L 2224/17181* (2013.01); *H01L 2224/32057* (2013.01); *H01L 2224/32059* (2013.01); *H01L 2224/32145* (2013.01); *H01L 2224/32225* (2013.01); *H01L 2224/33181* (2013.01); *H01L 2224/33505* (2013.01); *H01L 2224/73204* (2013.01); *H01L 2224/83203* (2013.01); *H01L 2224/83877* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01)

(56) References Cited

U.S. PATENT DOCUMENTS

| | | |
|---|---|---|
| 9,142,694 B2 | 9/2015 | Gerber et al. |
| 9,146,196 B2 | 9/2015 | Babiarz et al. |
| 9,472,531 B2 | 10/2016 | Zhang et al. |
| 2005/0263869 A1* | 12/2005 | Tanaka .................... H01L 24/16 257/686 |
| 2005/0280160 A1* | 12/2005 | Kim ........................ H01L 25/50 257/777 |
| 2007/0176275 A1* | 8/2007 | Singleton ................ H01L 24/32 257/686 |
| 2009/0267171 A1* | 10/2009 | Yean ....................... H01L 25/16 257/434 |
| 2012/0077312 A1 | 3/2012 | Lee et al. |
| 2013/0234320 A1* | 9/2013 | Lu ........................... H01L 24/97 257/737 |
| 2014/0183758 A1 | 7/2014 | Nakamura et al. |
| 2016/0013174 A1* | 1/2016 | Han ..................... H01L 21/6835 438/109 |
| 2017/0062367 A1* | 3/2017 | Jo ........................... H01L 22/32 |
| 2018/0166420 A1* | 6/2018 | Park ....................... H01L 23/31 |

FOREIGN PATENT DOCUMENTS

| | | |
|---|---|---|
| JP | 4780023 B2 | 9/2011 |
| JP | 2011-527758 A | 11/2011 |
| JP | 6103725 B2 | 3/2017 |
| KR | 10-0347376 B1 | 8/2002 |

\* cited by examiner

SEMICONDUCTOR PACKAGE HAVING RECESSED ADHESIVE LAYER BETWEEN STACKED CHIPS

CROSS-REFERENCE TO RELATED APPLICATION

This application claims benefit of priority under 35 USC § 119 to Korean Patent Application No. 10-2018-0114330 filed on Sep. 21, 2018 in the Korean Intellectual Property Office, the disclosure of which is incorporated herein by reference in its entirety.

BACKGROUND

1. Field

The present disclosure relates to a semiconductor package and a method of manufacturing the same.

2. Description of Related Art

As electronic devices have been increasingly more miniaturized and reduced in weight due to advancements and consumer demands in electronics industries, there has been the demand for a semiconductor package used in an electronic device to have high performance and high capacity, as well as to be more miniaturized and reduced in weight. For high performance and high capacity, along with miniaturization and weight reduction, the research and development of semiconductor chips including through substrate vias (TSVs), and semiconductor packages including such semiconductor chips stacked therein, have been undertaken.

SUMMARY

According to an exemplary embodiment of the present inventive concept, a semiconductor package includes a first semiconductor chip having a first through substrate via (TSV), a second semiconductor chip stacked on the first semiconductor chip and a first adhesive layer (e.g., non-conductive film) disposed between the first semiconductor chip and the second semiconductor chip. The second semiconductor chip includes a second through substrate via connected to the first through substrate via. A side surface of the first adhesive layer is recessed from side surfaces of the first and second semiconductor chips.

According to an exemplary embodiment of the present inventive concept, a semiconductor package includes a base substrate having a wiring circuit, semiconductor chips stacked in a direction perpendicular to an upper surface of the base substrate, a first adhesive layer disposed between the base substrate and a lowermost semiconductor chip and second adhesive layers. A side surface of the first adhesive layer is recessed from a side surface of the lowermost semiconductor chip. Each adhesive layers is disposed between corresponding two adjacent semiconductor chips of the semiconductor chips and has a side surface recessed from side surfaces of the corresponding two adjacent semiconductor chips.

According to an exemplary embodiment of the present inventive concept, a semiconductor package includes first and second semiconductor chips stacked in a vertical direction, and an adhesive layer disposed between the first semiconductor chip and the second semiconductor chip, each of the first and second semiconductor chips has a semiconductor substrate having a lower surface and an upper surface opposing each other, a semiconductor device layer disposed on the lower surface of the substrate, and a through silicon via penetrating the semiconductor substrate and the semiconductor device layer, the through substrate via of the first semiconductor chip is connected to the through substrate via of the second semiconductor chip, and a side surface of the adhesive layer is a concave surface recessed from side surfaces of the first and second semiconductor chips.

According to an exemplary embodiment of a method of manufacturing a semiconductor package is provided as follows. Each of semiconductor chips and each of first uncured adhesive layers are alternately stacked on each other. The first uncured adhesive layers are cured at a first temperature under a first pressure so that the first uncured adhesive layers are cured to form first cured adhesive layers each of which a side surface is recessed from side surfaces of corresponding two adjacent semiconductor chips. The first pressure is formed by using a pressurized fluid. The first temperature is above a curing temperature of the first uncured adhesive layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
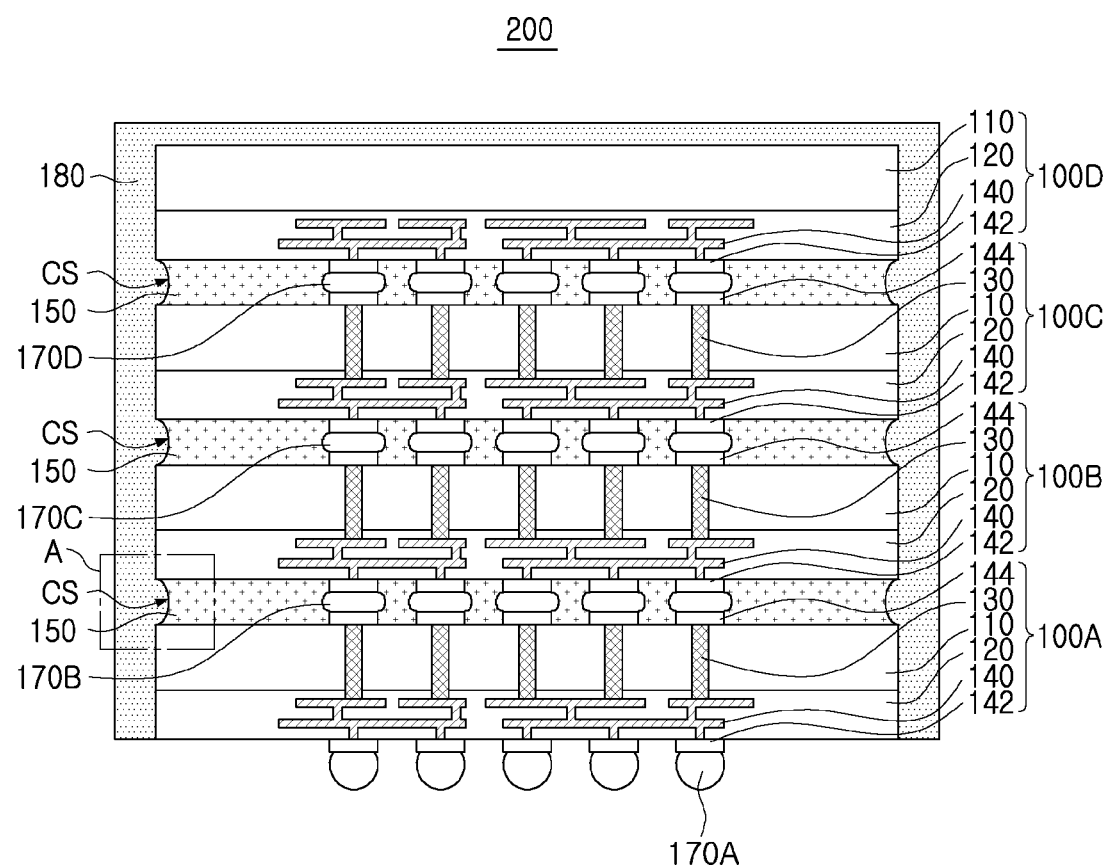
FIG. 1 is a cross-sectional view illustrating a semiconductor package according to example embodiments.

FIG. 1 is a cross-sectional view illustrating a semiconductor package according to example embodiments.

As shown in FIG. 1, a semiconductor package 200 may include a first semiconductor chip 100A, a second semiconductor chip 100B, a third semiconductor chip 100C, and a fourth semiconductor chip 100D. The first to fourth semiconductor chips 100A, 100B, 100C, and 100D may be electrically connected to semiconductor chips adjacent to each other through second to fourth connection bumps 170B, 170C, and 170D.

Further, the first to fourth semiconductor chips 100A, 100B, 100C, and 100D may be bonded to each other by non-conductive films (or adhesive layers) 150. A side surface CS of each of the non-conductive films 150 may be recessed from side surfaces of corresponding two adjacent semiconductor chips of the first to fourth semiconductor chips 100A, 100B, 100C, and 100D. As shown in the cross-sectional view illustrated in FIG. 1, the side surfaces CS of the non-conductive films 150 may have concave surfaces. In one example embodiment, the side surfaces CS of the non-conductive films 150 may have different recessed depths. Such shapes may enhance the bond strength with a molding member or may prevent defects from being developed in a subsequent process following a process of stacking semiconductor chips, as will be more fully described hereinafter.

The first to fourth semiconductor chips 100A, 100B, 100C, and 100D may be memory chips or logic chips. In one example embodiment, the first to fourth semiconductor chips 100A, 100B, 100C, and 100D may all be the memory chips of the same kind. In another example embodiment, some of the first to fourth semiconductor chips 100A, 100B, 100C, and 100D may be memory chips and the others are logic chips. In a specific embodiment, the first semiconductor chip 100A may be a logic chip, and the second to fourth semiconductor chips 100B, 100C, and 100D may be memory chips.

For example, the memory chips may be volatile memory chips such as dynamic random access memory (DRAM) chips and static random access memory (SRAM) chips, or may be non-volatile memory chips, such as phase-change random access memory (PRAM) chips, magnetoresistive random access memory (MRAM) chips, ferroelectric random access memory (FeRAM) chips, and resistive random access memory (RRAM) chips. In some example embodiments, the first to fourth semiconductor chips 100A, 100B, 100C, and 100D may be high bandwidth memory (HBM) DRAM.

The logic chips may be, for example, microprocessors, analogue devices, or digital signal processors.

Although a semiconductor package 200 having the first to fourth semiconductor chips 100A, 100B, 100C, and 100D stacked therein is illustrated in the present example embodiment, the number of semiconductor chips that may be stacked in the semiconductor package 200 is not limited thereto. For example, two, three, or even more semiconductor chips (for example, eight chips) may be stacked in the semiconductor package 200.

The first to fourth semiconductor chips 100A, 100B, 100C, and 100D may be identical chips, and as illustrated in FIG. 1, may have the same surface area. In some example embodiments, the first to fourth semiconductor chips 100A, 100B, 100C, and 100D may have different surface areas. Not all side surfaces of the semiconductor chips may be aligned to be substantially coplanar, and for example, at least portions of the side surfaces of the semiconductor chips may have a step-like alignment.

In this case, side surfaces of the non-conductive films may at least be recessed from the side surfaces of a semiconductor chip close to the center of the stack.

Each of the first to fourth semiconductor chips 100A, 100B, 100C, and 100D may include a semiconductor substrate 110, a semiconductor device layer 120, a through substrate via (TSV) 130, a lower connection pad 142, an upper connection pad 144, and first to fourth connection bumps 170A, 170B, 170C, and 170D. However, as illustrated in the present example embodiment, the fourth semiconductor chip 100D, disposed uppermost, may not include a through substrate via 130.

The semiconductor substrate 110 of each of the semiconductor chips 100A to 100D may include an upper surface and a lower surface opposing the upper surface. The semiconductor device layer 120 may be provided on the lower surface of the semiconductor substrate 110, and a wiring structure 140 may be provided within the semiconductor device layer 120. The through substrate via 130 may penetrate the semiconductor substrate 110 to connect the upper surface and the lower surface of the semiconductor substrate 110, thereby being connected to the wiring structure 140. The lower connection pad 142 may be formed on the semiconductor device layer 120 and may be electrically connected to the through substrate via 130 through the wiring structure 140. In some examples, the through substrate via 130 may extend not only through the semiconductor substrate 110, but may extend through the entire semiconductor chip (100A, 100B, 100C or 100D). The through substrate via 130 may be a through silicon via.

The semiconductor substrate 110 of each of the semiconductor chips 100A to 100D may be formed of a crystalline semiconductor material. For example, the semiconductor substrate 110 may be formed of a semiconductor material such as silicon and germanium, or a compound semiconductor material such as silicon carbide (SiC), gallium arsenide (GaAs), indium arsenide (InAs), and indium phosphide (InP). Further, the semiconductor substrate 110 may have a silicon-on-insulator (SOI) structure. For example, the semiconductor substrate 110 may include a buried oxide (BOX) layer. The semiconductor substrate 110 may include a conductive region, for example, a well doped with an impurity or a structure doped with an impurity. Furthermore, the semiconductor substrate 110 may include various device isolation structures, such as shallow trench isolation (STI) structures.

The semiconductor device layer 120 may be formed to include the wiring structure 140 to connect each of individual devices to other wirings formed in the semiconductor substrate 110. The wiring structure 140 may include a metal wiring layer and a via plug. For example, the wiring structure 140 may be a multilayer structure in which two or more metal wiring layers or two or more via plugs are alternately stacked.

The through substrate vias 130 may extend from the upper surface of the semiconductor substrate 110 towards the lower surface thereof, and may further extend into the semiconductor device layer 120. For example, the through substrate via 130 may partially penetrate the semiconductor device layer 120 to be connected to the wiring structure 140. At least portions of the through substrate vias 130 may have the shape of a pillar. As described above, the semiconductor chip disposed at the uppermost level (for example, the fourth semiconductor chip 100D) may not include the through substrate via 130.

The lower connection pad 142 may be disposed on the semiconductor device layer 120 and may be electrically connected to the wiring structure 140 within the semiconductor device layer 120. The lower connection pad 142 may be electrically connected to the through substrate vias 130 through the wiring structure 140. For example, the lower connection pad 142 may include at least one of aluminum (Al), copper (Cu), nickel (Ni), tungsten (W), platinum (Pt), and gold (Au).

Additionally, a lower passivation layer (not illustrated) may be formed on the semiconductor device layer 120 to protect the wiring structure 140 within the semiconductor device layer 120 and the other structures disposed therebelow from external stress and humidity. The lower connection pad 142 may be partially exposed from the lower passivation layer to be connected to one of a corresponding connection bump of the first to fourth connection bumps 170A to 170D.

The upper connection pad 144 may be formed on the upper surface of the semiconductor substrate 110 to be electrically connected to the through substrate vias 130. The upper connection pad 144 may include the same material as the lower connection pad 142. Also, an upper passivation layer (not illustrated) may be formed on the upper surface of the semiconductor substrate 110 to surround portions of the through substrate vias 130.

Each of the first to fourth connection bumps 170A, 170B, 170C, and 170D may be disposed on a corresponding lower connection pad 142 of the first to fourth semiconductor chips 100A, 100B, 100C, and 100D, respectively. For example, the first connection bump 170A may be formed by a pillar structure, a ball structure, or a solder layer.

Figure 5:
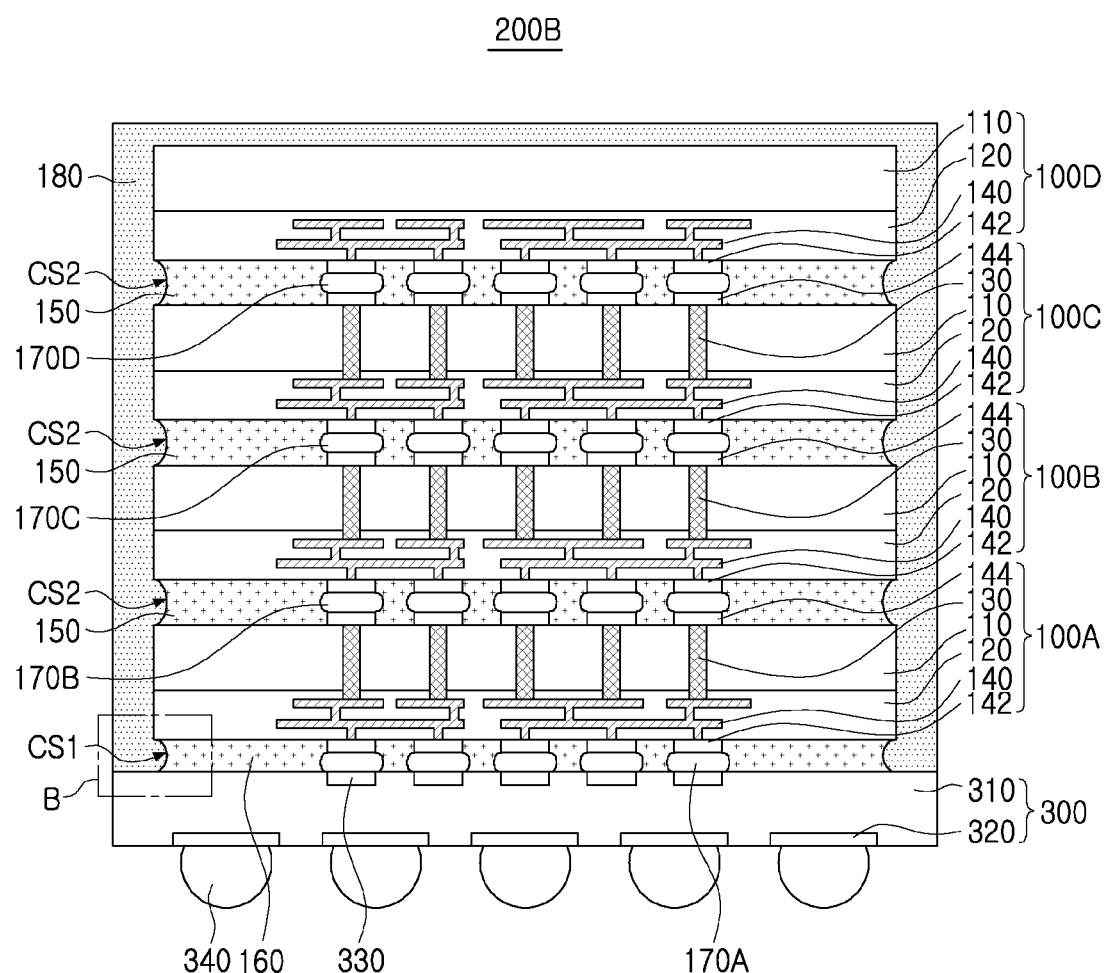
FIG. 5 is a cross-sectional view illustrating a semiconductor package according to example embodiments.

In the present example embodiment, the first connection bump 170A may be disposed on the lower connection pad 142 of the first semiconductor chip 100A so that the semiconductor package 200 is electrically connected to an external wiring circuit (for example, a base substrate 300 shown in FIG. 5). Through the first connection bump 170A, at least one of a control signal, a power signal, and a ground signal for operations of the first to fourth semiconductor chips 100A, 100B, 100C, and 100D, may be received from an external source; a data signal to be stored in the first to fourth semiconductor chips 100A, 100B, 100C, and 100D, may be received from an external source; or data stored in the first to fourth semiconductor chips 100A, 100B, 100C, and 100D, may be transmitted to the outside.

The second semiconductor chip 100B may be mounted on an upper surface of the first semiconductor chip 100A. The second semiconductor chip 100B may be electrically connected to the first semiconductor chip 100A through the second connection bump 170B, disposed between the first semiconductor chip 100A and the second semiconductor chip 100B.

Between the upper surface of the first semiconductor chip 100A and a lower surface of the second semiconductor chip 100B, a first non-conductive film (or a first adhesive layer) 150 may be disposed to bond the second semiconductor chip 100B to the first semiconductor chip 100A. In a similar manner, the third semiconductor chip 100C may be mounted on an upper surface of the second semiconductor chip 100B, and the fourth semiconductor chip 100D may be mounted on an upper surface of the third semiconductor chip 100C. Between the second semiconductor chip 100B and the third semiconductor chip 100C, the third connection bump 170C and a second non-conductive film (or a second adhesive layer) 150 surrounding side surfaces of the third connection bump 170C may be disposed. Between the third semiconductor chip 100C and the fourth semiconductor chip 100D, the fourth connection bump 170D and a third non-conductive film 150, surrounding side surfaces of the fourth connection bumps 170D, may be disposed.

The molding member 180 may surround side surfaces of the first to fourth semiconductor chips 100A, 100B, 100C, and 100D, and side surfaces of the non-conductive films 150. In some example embodiments, the molding member 180 may cover an upper surface of the fourth semiconductor chip 100D. Alternatively, in other example embodiments, the molding member 180 may be formed to have the upper surface of the fourth semiconductor chip 100D exposed externally (please refer to FIG. 4). The molding member 180 may include an epoxy mold compound (EMC) or the like.

As described above, for miniaturization and weight reduction of semiconductor packages, a stacked structure of the first and fourth semiconductor chips 100A, 100B, 100C, and 100D including the through substrate vias 130 is employed. In the process of stacking semiconductor chips, to achieve a uniform, electrically reliable and structurally reliable bond between the first to fourth semiconductor chips 100A, 100B, 100C, and 100D, the non-conductive films 150 may be used as an interlayer bonding material in conjunction with the second to fourth connection bumps 170B, 170C, and 170D.

However, after bonding of the semiconductor chips in a semiconductor package manufacturing process, if non-conductive films overflow around the semiconductor chips, a subsequent process may be improperly performed due to the overflowing of the non-conductive films. For example, the portions protruding from between the semiconductor packages 200 may cause overhangs or even defective bonds with the molding member 180. In severe cases, such overhangs, by being connected to each other, may render the molding member 180 unable to surround a corresponding side surface of the semiconductor substrate 110.

Therefore, in order to reduce portions of the non-conductive films 150 that may be likely to overflow, the semiconductor package manufacturing process may be conducted by reducing thicknesses of the non-conductive films, or by increasing viscosity of the non-conductive films. However, if only the thickness or viscosity of the non-conductive films 150 is reduced with respect to height of the connection bumps, the non-conductive films may cause insufficient filling problems. Consequently, the semiconductor chips adjacent to each other may not be bonded to have a uniform thickness, or voids between the semiconductor chips may be developed in the non-conductive films 150.

In order to solve the above problems, the semiconductor package 200 according to the present inventive concept, as described above, may include the non-conductive films 150 having the side surfaces that are recessed from the side surfaces of the adjacent semiconductor chips 100A, 100B, 100C, and 100D. More specifically, the side surfaces of the non-conductive films 150 may have concave surfaces. The recessed or concave side surfaces of the non-conductive films 150 may be obtained by curing the non-conductive films 150 disposed between the stacked first to fourth semiconductor chips 100A, 100B, 100C, and 100D through a hydrostatic bonding process using a pressurized fluid (for example, gas such as air or $N_2$).

As a result, prior to being cured or during a curing process, the non-conductive films 150 may be prevented from excessively overflowing to form overhangs and from having the insufficient filling problems at the same time. Accordingly, the bond strength between the molding member 180 and the non-conductive films 150 may be increased, thereby increasing the reliability of the semiconductor package.

The non-conductive films 150 may serve to bond the stacked semiconductor chips 100A, 100B, 100C, and 100D. The non-conductive films 150 may include an adhesive resin. The adhesive resin may be a thermosetting resin. The adhesive resin may include, for example, at least one of bisphenol epoxy resin, novolac epoxy resin, phenol resin, urea resin, melamine resin, unsaturated polyester resin, and resorcinol resin.

The non-conductive films 150 employed in the present example embodiment may have a relatively low viscosity so that recessed side surfaces of the non-conductive films 150 may be obtained. For example, the non-conductive films 150 in an uncured state may have a viscosity equal to or less than about 1,000 Pa·s, wherein the viscosity is the minimum viscosity of the non-conductive films 150 and is a measurement taken at about 100° C. The measured temperature may have an error range of about ±5° C. at 100° C.

In some example embodiments, the non-conductive films 150 may include a flux and/or a ceramic filler. The flux may be used in soldering to form an electrical bond between the semiconductor chips in the semiconductor package manufacturing process. The flux may increase spreadability and/or wettability of a solder, and the flux may be coated in advance on areas on which the solder will be coated, or may be included within the non-conductive films 150. The flux may be classified as resin-based, organic, and inorganic, wherein the flux generally used in electronic devices may include a resin-based flux. For example, the resin-based flux may include rosin, modified rosin, and synthetic resin. The ceramic filler, depending on a particle size and a percentage thereof, may be used to adjust the viscosity of the non-conductive films.

Figure 2:
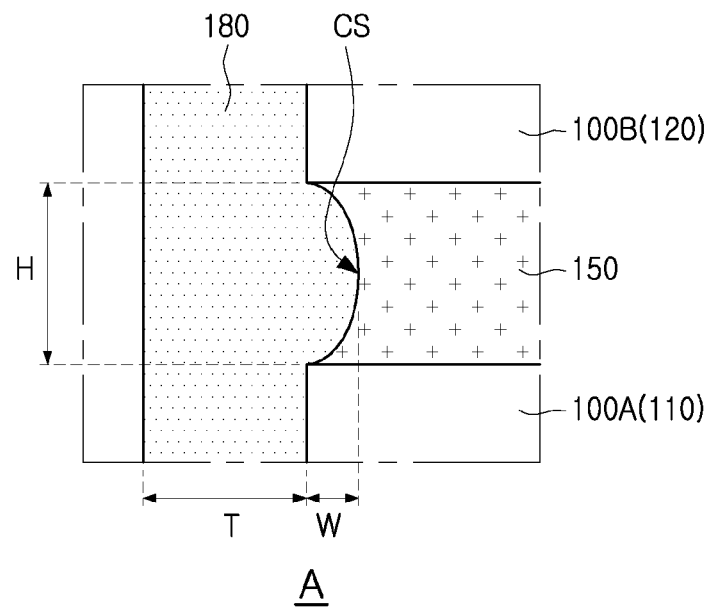
FIG. 2 is an enlarged cross-sectional view illustrating region "A" of FIG. 1.

FIG. 2 is an enlarged cross-sectional view illustrating the region "A" shown in FIG. 1.

FIG. 2 illustrates a non-conductive film 150 located between the first and second semiconductor chips 100A and 100B. As described above, a side surface CS of the non-conductive film 150 may have a side surface recessed from between the semiconductor substrate 110 of the first semiconductor chip 100A and the semiconductor device layer 120 of the second semiconductor chip 100B. The recessed side surface CS may have a concave surface. The molding member 180 may have a region protruding into a recessed area between the first and second semiconductor chips 100A and 100B to be in contact with the side surface CS of the non-conductive film 150. The recessed side surface CS may have a shape that is recessed from side surfaces of the first and second semiconductor chips 100A and 100B by a predetermined depth W. For example, the bottom of the recessed side surface CS may be positioned at the predetermined depth W from the region between the first and second semiconductor chips 100A and 100B. The predetermined depth W of the molding member 180 may be relatively large in the region between the first and second semiconductor chips 100A and 100B.

As the final height H between the first semiconductor chip 100A and the second semiconductor chip 100B, after the semiconductor package manufacturing process is completed, becomes slightly smaller than the initial thickness of the non-conductive film 150 through compression and curing processes, the non-conductive film 150 may overflow into neighboring regions (for example, side surfaces) of the semiconductor chips 100A and 100B in the semiconductor package manufacturing process. However, in the present example embodiment, the non-conductive film 150 may be cured under pressure applied by the pressurized fluid during the hydrostatic bonding process to thus obtain the side surface CS recessed from the side surfaces of the first and second semiconductor chips 100A and 100B. Throughout this process, the non-conductive film 150 may be compressed with the pressure applied by the pressurized fluid and internal voids in the non-conductive film 150 may be removed. Accordingly, the non-conductive film 150 may be more securely bonded with the connection bump 170B and/or the first and second semiconductor chips 100A and 100B.

Factors controlling the concave side surface CS of the non-conductive film 150 include the viscosity of the non-conductive film 150 in an uncured state and the processing conditions of a hydrostatic bonding process (for example, temperature, pressure, curing speed, etc.). Such processing conditions will be more fully described below.

The recessed non-conductive film 150 between the first semiconductor chip 100A and the second semiconductor chip 100B may be formed without overhangs that may cause problems in a molding process, preventing defects due to the overhangs of the non-conductive film 150 and increasing the filling rate of the non-conductive film 150. For example, the filling rate may be increased by removing the voids in the non-conductive film 150. Accordingly, the recessed non-conductive film 150 may increase the reliability of the semiconductor package 200 by enhancing the bond strength between the molding member 180 and the non-conductive film 150.

Figure 3:
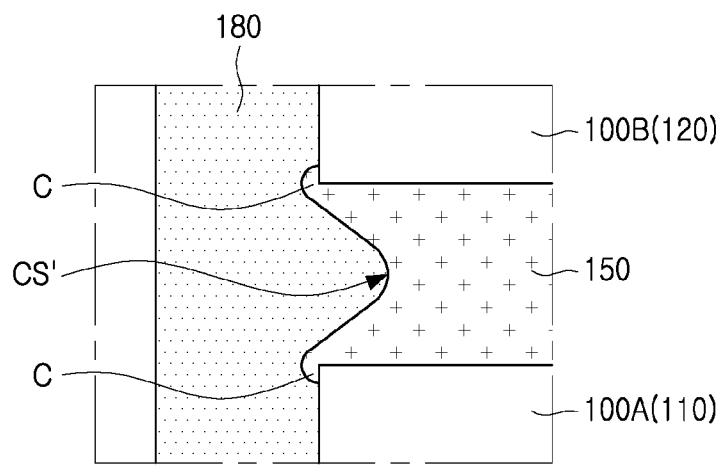
FIG. 3 is an enlarged cross-sectional view of a non-conductive film employed in a semiconductor package according to example embodiments.

The concave side surface CS of the non-conductive film 150 may have varied shapes, depending upon viscosity of the non-conductive film 150 in an uncured state and/or processing conditions of the hydrostatic bonding. FIG. 3 is an enlarged cross-sectional view illustrating a non-conductive film employed in a semiconductor package according to another example embodiment.

As illustrated in FIG. 3, a recessed side surface CS' of the non-conductive film 150 may have a shape that is more concavely recessed from side surfaces of the first and second semiconductor chips 100A and 100B, as compared to the previous example embodiment. The recessed side surface CS' may further include areas C formed to cover portions of the side surfaces of the first and second semiconductor chips 100A and 100B. The recessed side surface CS' may be formed when portions of the non-conductive film 150 in an uncured state that were covering the portions of the side surfaces of the adjacent semiconductor chips 100A and 100B in the compression process for pre-bonding are recessed during the hydrostatic bonding process.

As described above, the non-conductive film 150 according to the present example embodiment is not limited to having its entire surface area recessed from the side surfaces of the semiconductor chips 100A and 100B, and for example, the non-conductive film 150 may further include a portion protruding from, or remaining atop, the side surfaces of the adjacent semiconductor chip.

The present inventive concept according to example embodiments may be applied to semiconductor packages in various other forms.

Figure 4:
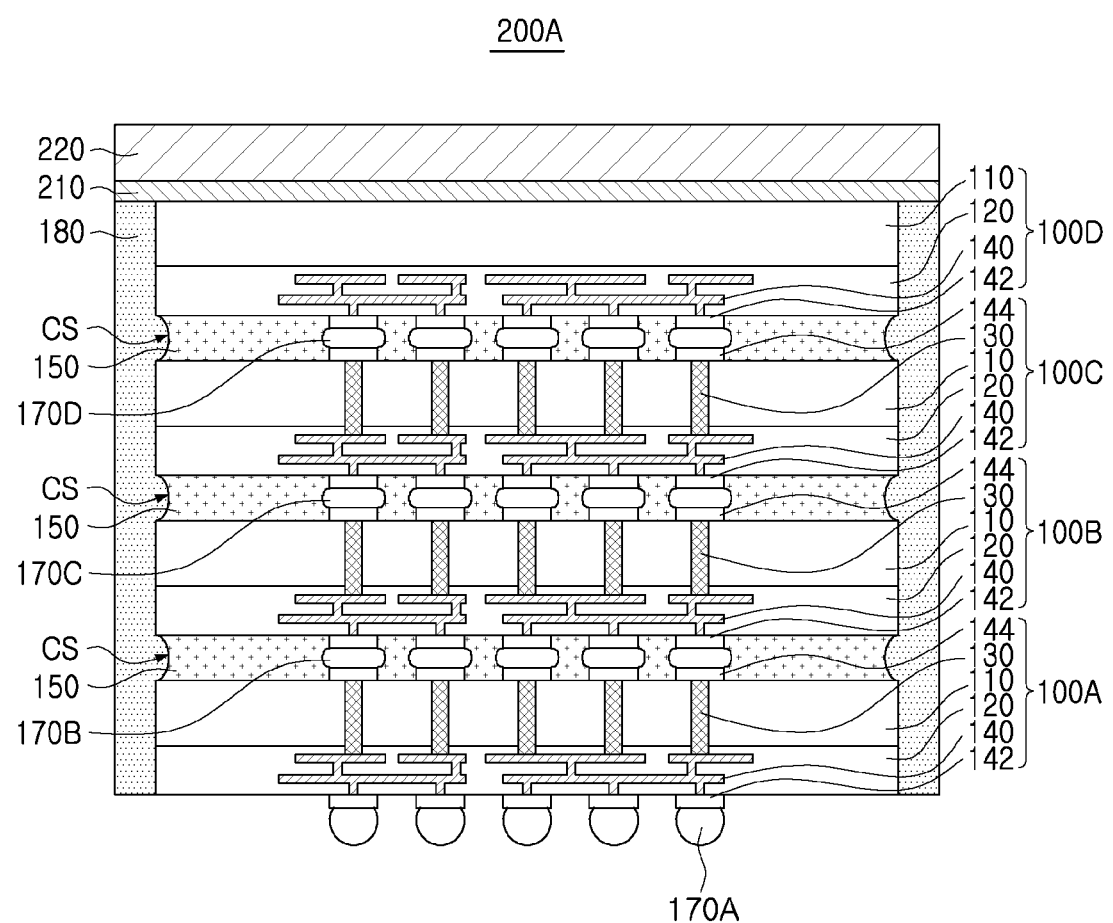
FIG. 4 is a cross-sectional view illustrating a semiconductor package according to example embodiments.

FIG. 4 is a cross-sectional view illustrating a semiconductor package according to example embodiments.

As illustrated in FIG. 4, a semiconductor package 200A according to the present example embodiment may have a similar structure to that of the example embodiment illustrated in FIG. 1 except for a heat radiating plate on an uppermost semiconductor chip of the semiconductor chips 100A to 100D. Accordingly, the description of the example embodiment illustrated in FIG. 1 may be combined with the description of this particular example embodiment unless otherwise specified.

The semiconductor package 200A according to the present example embodiment, similarly to the foregoing example embodiment, may include vertically stacked first to fourth semiconductor chips 100A, 100B, 100C, and 100D, and may further include a heat conducting material layer 210 and a heat radiating plate 220, sequentially disposed on an upper surface of the fourth semiconductor chip 100D.

The heat conducting material layer 210 may be disposed between the heat radiating plate 220 and the fourth semiconductor chip 100D, and may cover the upper surface of the fourth semiconductor chip 100D. The heat conducting material layer 210 may permit heat generated by the first to fourth semiconductor chips 100A, 100B, 100C, and 100D, to be released to the heat radiating plate 220 more easily. The heat conducting material layer 210 may be formed of a thermal interface material (TIM). For example, the heat conducting material layer 210 may be formed of an insulating material or a material containing an insulating material having electrical insulation properties. The heat conducting material layer 210 may include, for example, an epoxy resin. Particular examples of the heat conducting material layer 210 may include mineral oil, grease, gap filler putty, phase change gel, phase change material pads, or particle filled epoxy.

The heat radiating plate 220 may be disposed on the heat conducting material layer 210. The heat radiating plate 220 may be, for example, a heat sink, a heat spreader, a heat pipe, or a liquid cooled cold plate.

The heat conducting material layer 210 entirely covering the upper surface of the fourth semiconductor chip 100D may increase the contact area between the fourth semiconductor chip 100D and the heat conducting material layer 210, and thus, heat generated by the first to fourth semiconductor chips 100A, 100B, 100C, and 100D may be transferred to the heat radiating plate 220 more efficiently.

FIG. 5 is a cross-sectional view illustrating a semiconductor package according to example embodiments.

As illustrated in FIG. 5, a semiconductor package 200B, except further including a base substrate, may include a similar structure to that of the example embodiment illustrated in FIG. 1. Accordingly, the description of the example embodiment illustrated in FIG. 1, unless otherwise specified, may be combined with the description of this particular example embodiment.

The semiconductor package 200B according to the present example embodiment may include a base substrate 300 and first to fourth semiconductor chips 100A, 100B, 100C, and 100D, mounted on the base substrate 300 and sequentially stacked in a direction perpendicular to an upper surface of the base substrate 300.

The base substrate 300 may be, for example, a printed circuit board, a ceramic board, or an interposer. When the base substrate 300 is a printed circuit board, the base substrate 300 may include a substrate body 310, a lower surface pad 320, an upper surface pad 330, and solder resist layers (not illustrated) formed on a lower surface and an upper surface of the substrate body 310. Inside the substrate body 310, an internal wiring (not illustrated) may be formed to electrically connect the lower surface pad 320 and the upper surface pad 330. The lower surface pad 320 and the upper surface pad 330 may be portions of circuit wirings exposed by the solder resist layers formed on the lower surface and the upper surface of the substrate body 310, respectively, the circuit wirings having been patterned on the lower surface and the upper surface of the substrate body 310 covered with Cu foil.

In some example embodiments, the base substrate 300 may be an interposer. In this case, the base substrate 300 may include a substrate body 310 formed of a semiconductor material, and may include the lower surface pad 320 and the upper surface pad 330 formed on the lower surface and the upper surface of the substrate body 310, respectively.

The substrate body 310 may be, for example, formed from a silicon wafer. Also, an internal wiring (not illustrated) may be formed on the lower surface or the upper surface of the substrate body 310, or inside the substrate body 310. Also, inside the substrate body 310, a through substrate via (not illustrated) may be formed to electrically connect the lower surface pad 320 and the upper surface pad 330.

An external connection terminal 340 may be bonded to the lower surface of the base substrate 300. For example, the external connection terminal 340 may be bonded to the lower surface pad 320. The external connection terminal 340 may be, for example, a solder ball or a bump. The external connection terminal 340 may electrically connect between the semiconductor package 200B and an external device.

In the present example embodiment, the first to fourth semiconductor chips 100A, 100B, 100C, and 100D may all have the same surface area, whereas the base substrate 300 may have a surface area larger than the surface area of each of the first to fourth semiconductor chips 100A, 100B, 100C and 100D.

On the base substrate 300, a molding member 180 may be formed to partially or entirely encapsulate the first to fourth semiconductor chips 100A, 100B, 100C, and 100D. The molding member 180 may include, for example, an epoxy mold compound. As illustrated in FIG. 5, the molding member 180 may be disposed on the base substrate 300 and may have substantially flat coplanar surfaces with side surfaces of the base substrate 300. Such coplanar side surfaces may be obtained by the same cutting process (please refer to the process in FIG. 12).

The first to fourth semiconductor chips 100A, 100B, 100C, and 100D, in a manner similar to the foregoing example embodiment, may be bonded to each other by second non-conductive films (or second adhesive layers) 150. Each of side surfaces CS2 of the second non-conductive films 150 may be recessed from side surfaces of two corresponding adjacent semiconductor chips of the semiconductor chips 100A, 100B, 100C, and 100D. The side surfaces CS2 of the second non-conductive films 150 may have concave surfaces.

A first non-conductive film (or a first adhesive layer) 160 may be disposed between the base substrate 300 and the first semiconductor chip 100. In some example embodiments, the first non-conductive film 160 may be formed of the same or a similar material as the second non-conductive films 150. In some example embodiments, the first non-conductive film 160 may be formed of a different material than the second non-conductive films 150, for example, an underfill material layer. The first non-conductive film 160 may be disposed between the base substrate 300 and the first semiconductor chip 100A to surround side surfaces of first connection bumps 170A. The first non-conductive film 160 may be formed of, for example, an epoxy resin. For example, a thickness of the first non-conductive film 160 may be smaller than a thickness of each the non-conductive film 150.

In one example embodiment, the side surface CS1 of the first non-conductive film 160 has a first recessed depth, and each the side surfaces CS2 of the second non-conductive film 150 has a second recessed depth. The first recessed depth may be different from the second recessed depth.

Figure 6:
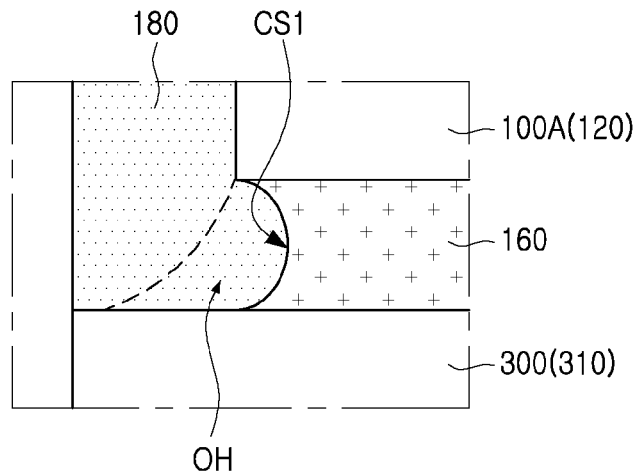
FIG. 6 is an enlarged cross-sectional view of region "B" of FIG. 5.

FIG. 6 is an enlarged cross-sectional view illustrating region "B" of FIG. 5. FIG. 6 illustrates the first non-conductive film 160 located between the base substrate 300 and the first semiconductor chip 100A.

Unlike the second non-conductive films 150 disposed between the semiconductor chips of the same size, the first non-conductive film 160, due to the base substrate 300 bonded therebelow having a comparatively larger surface area, may be more likely to overflow due to an increased surface tension between the base substrate 300 and the first non-conductive film 160 in an uncured state. Since the base substrate 300 may be used similarly as a carrier substrate during the semiconductor package manufacturing process, the first non-conductive film 160 in an uncured state may flow out onto an upper surface of the base substrate 300, thereby forming an overhang OH (a portion of the non-conductive film that expands onto the base substrate 300, as illustrated by the dashed line in FIG. 6). This overhang OH may covers the upper surface of the base substrate 300, thereby reducing an area of the base substrate 300 on which the molding member 180 is later formed. The reduction in the area of the upper surface of the base substrate 300 may cause defective connection between the molding member 180 and the base substrate 300, thereby rendering the molding member 180 unable to serve as an appropriate passivation structure. For example, the molding member 180 may be lifted or moisture may penetrate the molding member 180.

To solve the above issue, in the present example embodiment, in a similar manner to the second non-conductive films 150, side surfaces of the first non-conductive film 160 may be recessed from between the base substrate 300 and the first semiconductor chip 100B, through a hydrostatic bonding process for curing the non-conductive films 160 and 150 in uncured states. By forming the recessed side surfaces CS1 with concave surfaces, an undesired overhanging portion OH may be avoided in the curing of the non-conductive films 160 and 150 in uncured states.

As described above, in the present example embodiment, the first and second non-conductive films 160 and 150 in uncured states may be cured under pressure applied by a pressurized fluid in a hydrostatic bonding process, and thus may have side surfaces recessed from side surfaces of adjacent semiconductor chips. Through this process, internal voids present inside the first and second non-conductive films 160 and 150 may be eliminated, and also, the first and second non-conductive films 160 and 150 may become more securely bonded with the connection bumps. Thus, a secure bond may be achieved by preventing defects due to an overflow of the non-conductive films 160 and 150 in uncured states from being developed and by increasing filling rates of the non-conductive film 150.

The concave side surfaces CS1 and CS2 of the first and second non-conductive films 160 and 150 may be controlled through controlling processing conditions (for example, temperature, pressure, curing speed, etc.) of the hydrostatic bonding process, and also through controlling the properties, such as viscosity, of the first and second non-conductive films 160 and 150 in uncured states. For example, the first and second non-conductive films 160 and 150 in uncured states may have viscosity of about 1,000 Pa·s or less.

Figure 7:
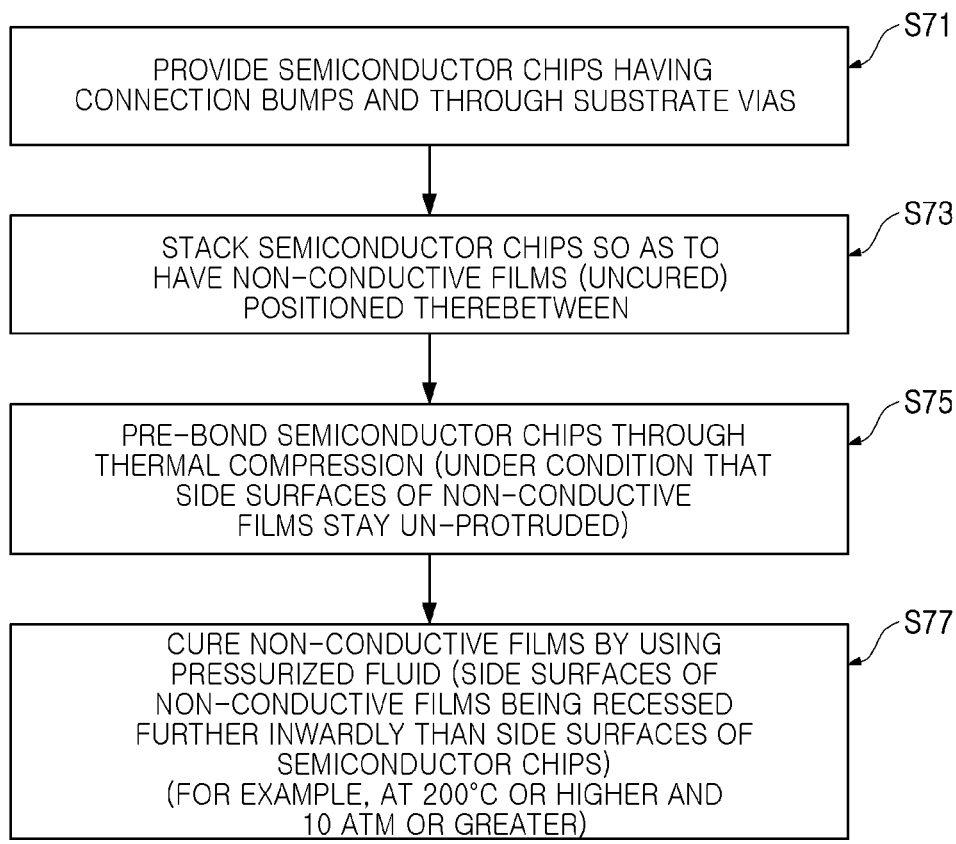
FIG. 7 is a process flowchart illustrating a method of manufacturing a semiconductor package according to an example embodiment.

FIG. 7 is a process flowchart illustrating a method of manufacturing a semiconductor package according to example embodiments.

As illustrated in FIG. 7, a method of manufacturing a semiconductor package according to the present example embodiment may start with preparing a plurality of semiconductor chips having connection bumps and through substrate vias (S71).

Each of the plurality of semiconductor chips may include, in addition to the connection bumps and the through substrate vias, a semiconductor substrate, a semiconductor device layer, lower connection pads, and upper connection pads. Descriptions of each of these components may be combined with the description of semiconductor chips illustrated in FIG. 1.

The plurality of semiconductor chips may be memory chips or logic chips, and in some example embodiments, may include memory chips of the same size.

Subsequently, the plurality of semiconductor chips may be stacked such that uncured non-conductive films may be disposed between the plurality of semiconductor chips (S73). For example, the uncured non-conductive films correspond to the non-conductive films in uncured states described above and may be an example of an uncured adhesive layer.

The uncured non-conductive film may include an uncured adhesive resin. For example, the adhesive resin may include at least one of the thermosetting resins described above. The uncured non-conductive film employed in the present example embodiment may have low enough viscosity that permits the uncured non-conductive film to obtain a desired shape (for example, a side surface having a concave surface) during the hydrostatic bonding process. For example, the uncured non-conductive film may have viscosity of about 1,000 Pa·s or less.

In some example embodiments, before a plurality of semiconductor chips are stacked, an uncured non-conductive film may be provided on a surface of each semiconductor chip that has connection bumps formed thereon. In this case, the uncured non-conductive film may be in a partially cured state (that is, at B-stage). The uncured non-conductive film to be used in these example embodiments may not be limited to film types. For example, the uncured non-conductive film may be applied and used in a paste state.

Next, the plurality of stacked semiconductor chips may be pre-bonded through thermal compression of the plurality of semiconductor chips (S75).

The pre-bonding process may be conducted so that the plurality of semiconductor chips remain stacked through a subsequent hydrostatic bonding process. In the environment where the non-conductive films are uncured, the plurality of semiconductor chips may be pre-bonded by exploiting adhesive properties of the non-conductive films.

In this pre-compression process, an appropriate temperature and/or pressure may be applied to prevent side surfaces of the uncured non-conductive films from protruding. By preventing the uncured non-conductive films from over-flowing onto side surfaces of the semiconductor chips, a recess process of the non-conductive films obtaining concave side surfaces may be conducted more conveniently in the hydrostatic bonding process. In some example embodiments, even when portions of the non-conductive films have over-flowed onto the side surfaces of the semiconductor chips, it may still be possible for the non-conductive films to obtain side surfaces in a desired shape, depending on viscosity of the non-cured non-conductive films and/or processing conditions of the hydrostatic bonding process.

Subsequently, the non-conductive films may be cured by using a pressurized fluid (S77) of the hydrostatic bonding process.

In this process, a hydrostatic pressure of the pressurized fluid and a curing temperature of the uncured non-conductive films may be applied to the stacked semiconductor chips, thereby curing the non-conductive films. More specifically, as illustrated in FIG. 8, in an example hydrostatic bonding process, the uncured non-conductive films, once heated to a curing temperature thereof, may be immediately subjected to the hydrostatic pressure by the pressurized fluid, and once the uncured non-conductive films are sufficiently cured to form the non-conductive films of FIGS. 1, 4 and 5, for example, the temperature may be lowered below the curing temperature and the pressure may be released.

Figure 8:
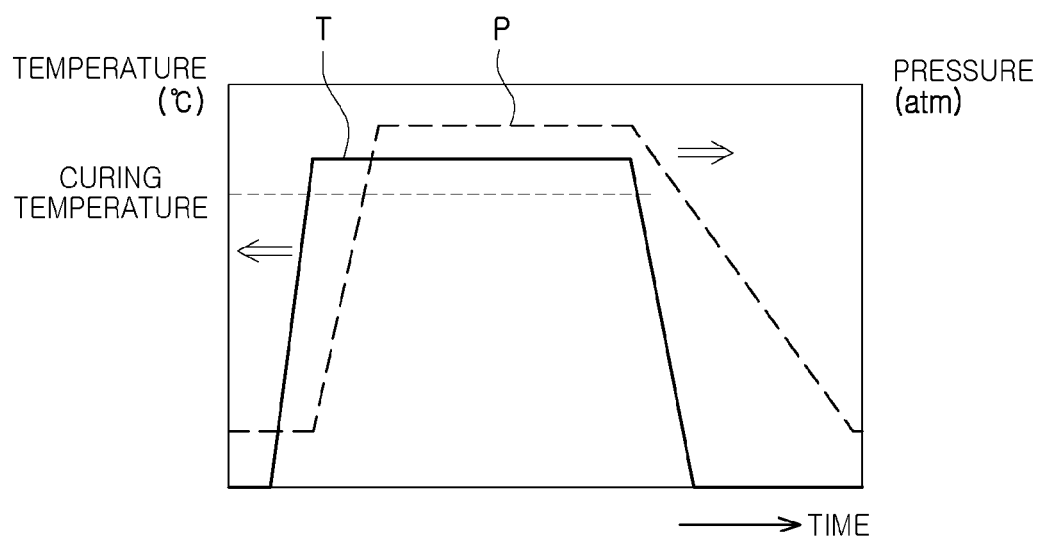
FIG. 8 is a curing temperature and pressure versus time graph illustrating a hydrostatic bonding process employed in a method of manufacturing a semiconductor package according to an example embodiment.

In this process, since the hydrostatic pressure by the pressurized fluid is applied even to the side surfaces of the non-conductive films, the side surfaces of the uncured non-conductive films may be recessed from the side surfaces of the plurality of semiconductor chips during the curing process as shown in FIG. 8. The present invention is not limited thereto. For example, the side surfaces of the uncured non-conductive films may be recessed from the side surfaces of the plurality of semiconductor chips before the curing process, by applying the hydrostatic pressure before applying a temperature above the curing temperature to the semiconductor chips. To facilitate such a recess process, this process may be conducted at a temperature and/or pressure slightly higher than hydrostatic bonding processes. In some example embodiments, the hydrostatic bonding process may be conducted at about 200° C. or greater and about 10 atm or greater (with respect to the maximum point in FIG. 8). For example, the hydrostatic bonding process may be conducted at about 250° C. and about 15 atm.

FIGS. 9 to 12 are cross-sectional views illustrating a method of manufacturing a semiconductor package according to example embodiments. The method of manufacturing a semiconductor package will be described with reference to a method of manufacturing a semiconductor package 200B illustrated in FIG. 5. FIGS. 9 to 12 will be described with reference to the process flowchart of FIG. 7.

Figure 9:
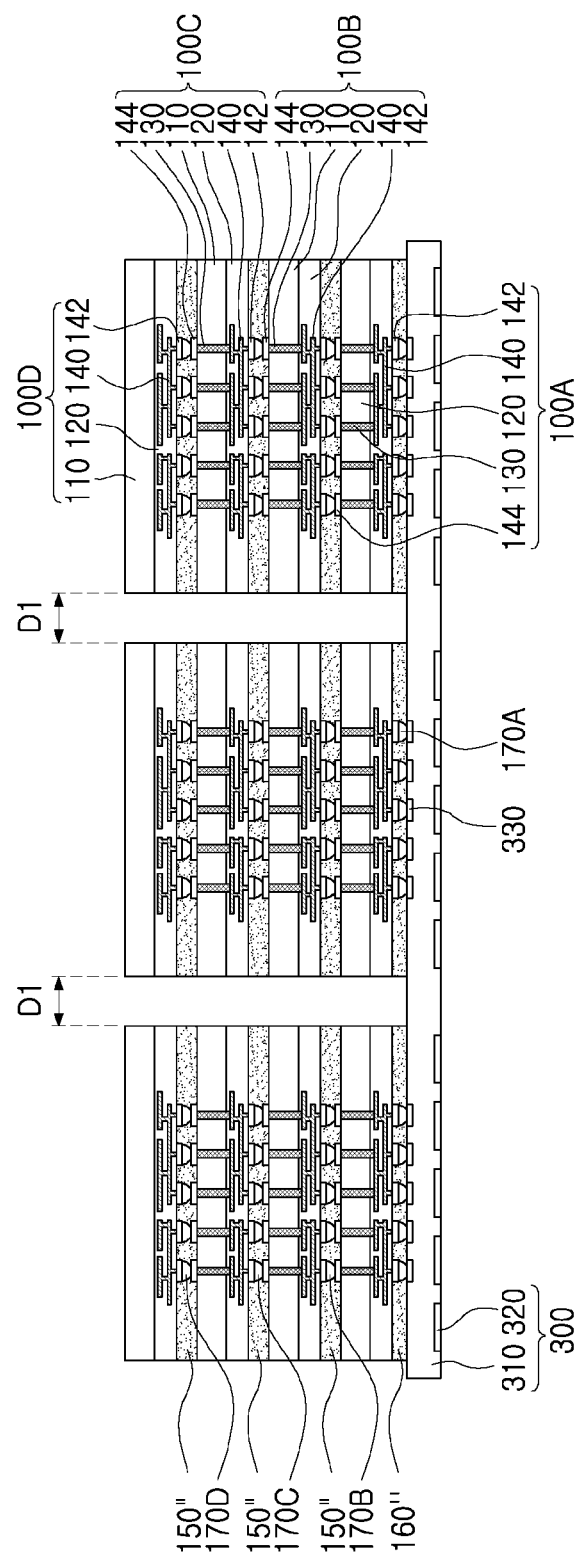
FIGS. 9 to 12 are cross-sectional views for describing a method of manufacturing a semiconductor package according to an example embodiment.

FIG. 9 illustrates three stacked semiconductor chips disposed on a base substrate 300 by performing steps S71 and S73 of FIG. 7. Each stacked semiconductor chip has a structure in which first to fourth semiconductor chips 100A, 100B, 100C, and 100D are sequentially stacked while having uncured first and second non-conductive films 160″ and 150″ disposed therebetween.

In the present example embodiment, the first to fourth semiconductor chips 100A, 100B, 100C, and 100D that are singulated from a wafer may be stacked on the base substrate 300. The base substrate 300 may serve as a carrier substrate in a subsequent process. The first to fourth semiconductor chips 100A, 100B, 100C, and 100D may be semiconductor chips of the same kind (for example, memory chips). Alternatively, at least one of the first to fourth semiconductor chips 100A, 100B, 100C, and 100D may be a different semiconductor (a different memory chip or a logic chip) than the others.

For example, the first semiconductor chips 100A singulated from a wafer may be aligned at a uniform distance (D1) on a carrier substrate (not illustrated) by using a semiconductor chip transfer device (not illustrated), and then by using a carrier substrate, the first semiconductor chips 100A may be transferred onto the base substrate 300 to have connection bumps 170A positioned on an upper surface pad 330 of the base substrate 300. As described above, the uncured first non-conductive film 160″ may be provided on lower surfaces of the first semiconductor chips 100A and/or upper surfaces of the base substrate 300, before the first semiconductor chips 100A are stacked on the base substrate 300. Likewise, the second to fourth semiconductor chips 100B, 100C, and 100D may be sequentially transferred to thereby provide a stack structure illustrated in FIG. 9.

In other example embodiments, the first to fourth semiconductor chips 100A, 100B, 100C, and 100D may be transferred at a wafer level. For example, in the case of a semiconductor package manufacturing process illustrated in FIG. 1, the first to fourth semiconductor chips 100A, 100B, 100C, and 100D may be singulated to a desired distance after being transferred on a carrier substrate at the wafer level.

More specifically, the distance D1 may be such a distance that permits the molding member (180 in FIG. 2) to surround side surfaces of the first to fourth semiconductor chips 100A, 100B, 100C, and 100D, and side surfaces of the first and second non-conductive films 160 and 150. Since in the subsequent process the uncured non-conductive films 160″ and 150″ may be controlled to be recessed, not protruded, this distance D1 may be determined to an appropriate size without consideration for overhanging portions of the non-conductive films after being cured (in particular, the first non-conductive film 160).

Figure 10:
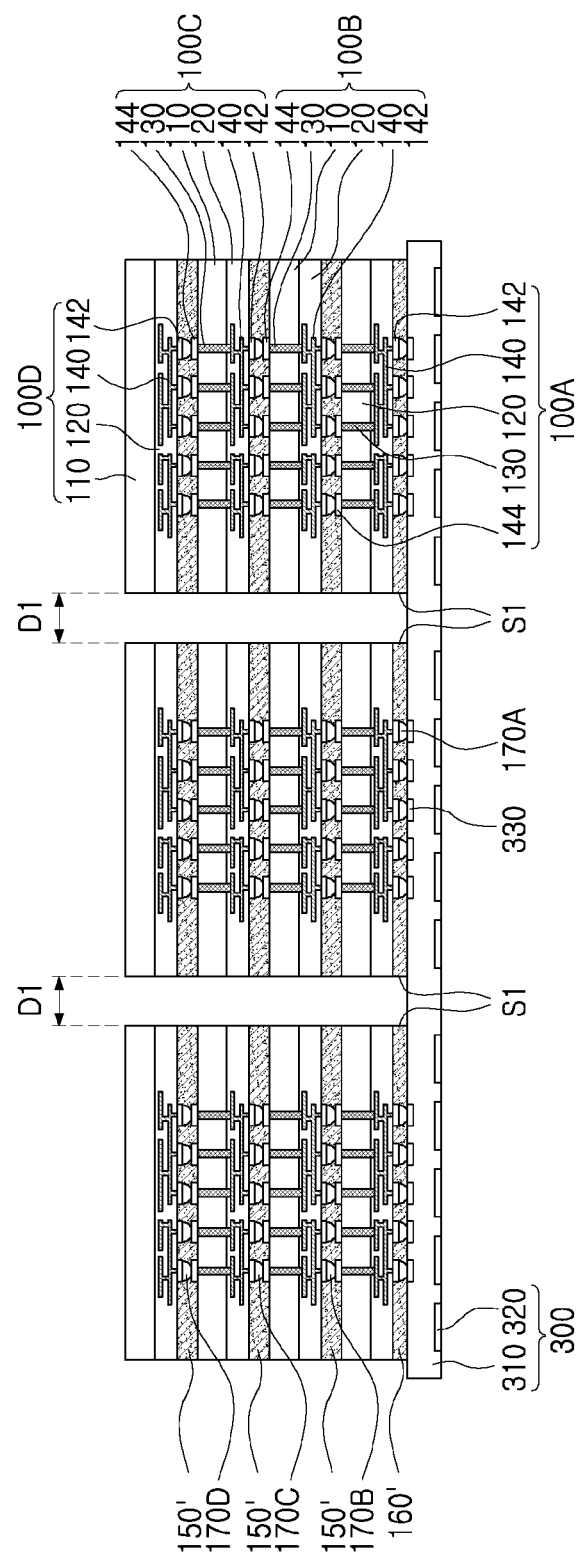

As illustrated in FIG. 10, the first to four semiconductor chips 100A, 100B, 100C, and 100D in each stacked semiconductor chip may be pre-bonded through thermal compression of the stacked semiconductor chips by performing step S75 of FIG. 7.

After completing the step S75, the base substrate 300 and the first semiconductor chip 100A, and the stacked semiconductor chips 100A, 100B, 100C, and 100D may be in temporarily bonded state during a subsequent process, by the adhesive properties of the first and uncured second non-conductive films 160′ and 150′ which remain uncured. For example, the step S75 may be conducted under the condition that the first and second uncured non-conductive films 160′ and 150′ remain uncured. Further, an appropriate temperature and/or pressure may be applied during a pre-compression process to prevent the side surfaces of each of the first and second uncured non-conductive films 160′ and 150′ from being protruded from between two adjacent semiconductor chips of the semiconductor chips 100A to 100D. In this case, the first and second uncured non-conductive films 160′ and 150′ may be prevented from overflowing onto the side surfaces of adjacent semiconductor chips, thereby allowing the non-conductive films 150 and 160 of FIG. 11 to obtain concave side surfaces in step S77 of FIG. 7.

Figure 11:
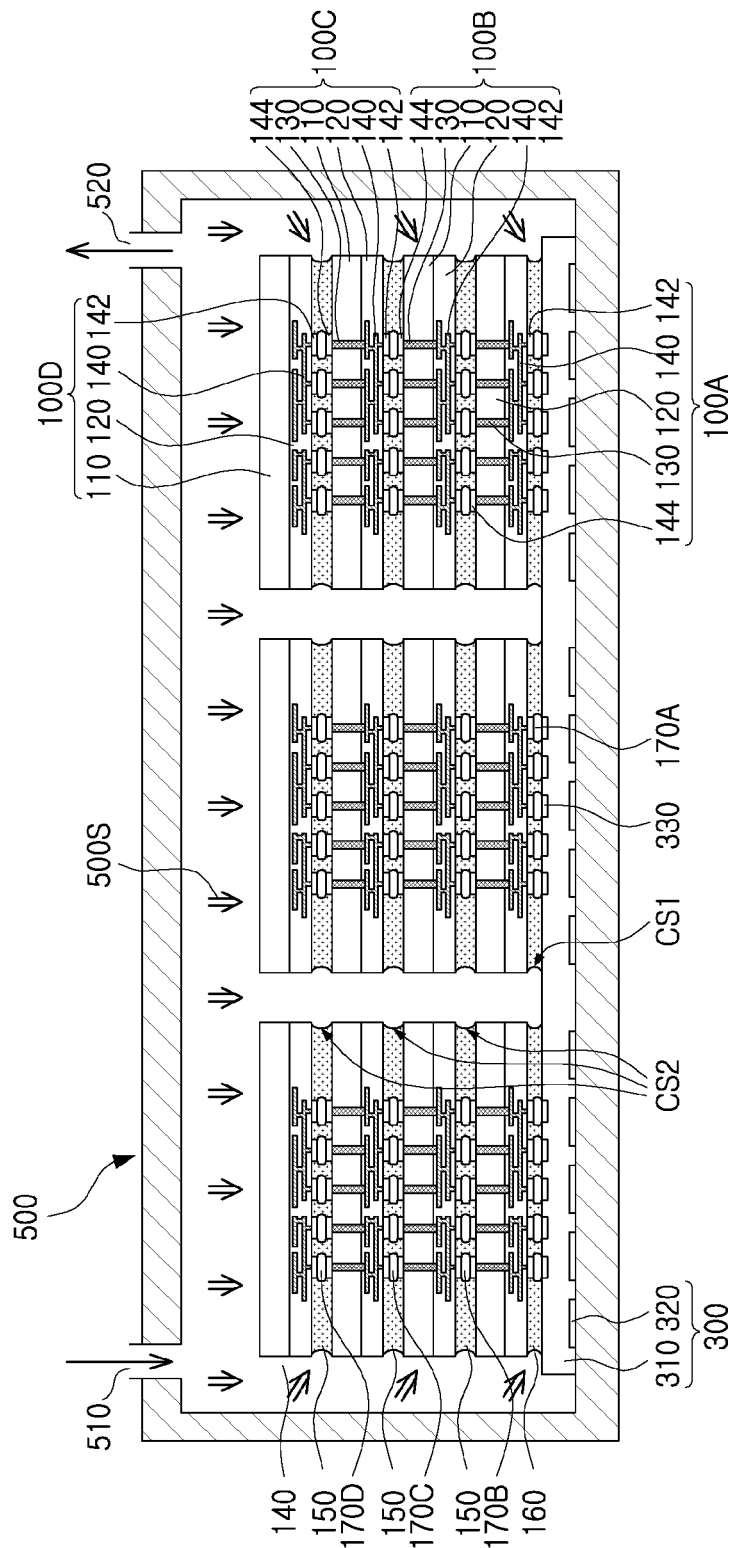

As illustrated in FIG. 11, the stacked semiconductor chips obtained in FIG. 10 may be disposed in a hydrostatic chamber 500 to cure the first and second uncured non-conductive films 160′ and 160′ by using a pressurized fluid in step S77.

The hydrostatic chamber 500 used in this process may include a sealed inner space with an inlet 510 and an outlet 520 for the pressurized fluid. For example, the stacked semiconductor chips may be disposed inside the inner space and heated to a curing temperature of the first and second uncured non-conductive films 160′ and 150′, and the pressurized fluid may be injected therein to apply the hydrostatic pressure to each of the stacked semiconductor chips.

In the hydrostatic bonding process of S77, a predetermined heat and pressure may be applied to the first and second uncured non-conductive films 160′ and 150′ and the connection bumps 170A, 170B, 170C, and 170D, disposed between the base substrate 300 and the first to fourth semiconductor chips 100A, 100B, 100C, and 100D. The first and second uncured non-conductive films 160′ and 150′ may be cured, thereby enhancing the bond between the semiconductor chips adjacent to the base substrate. The connection bumps 170A, 170B, 170C, and 170D may include an intermetallic compound to lower the contact resistance between upper connection pads 144 located therebelow.

Since the hydrostatic pressure by the pressurized fluid is applied to the side surfaces of the first and second non-conductive films 160 and 150 as well, the first and second non-conductive films 160 and 150 may be recessed from side surfaces of the adjacent semiconductor chips before or during the curing process. To facilitate this recess process, this hydrostatic bonding process may be conducted at a temperature and/or pressure higher than typical hydrostatic bonding processes. In some example embodiments, the hydrostatic bonding process of step S77 may be conducted at 200° C. or higher and 10 atm or higher. For example, the hydrostatic bonding process may be conducted at about 250° C. and about 15 atm. In an exemplary embodiment, the pre-bonding process of step S75 may be performed at a temperature below the temperature of the hydrostatic bonding process of step S77 under a pressure below the pressure of the hydrostatic bonding process of step S77. For example, the pre-bonding process may be performed at a temperature below a curing temperature of the uncured non-conductive films 160" and 150" and the hydrostatic bonding process may be performed at a temperature above the curing temperature.

Through this recess process, internal voids of the first and second non-conductive films 160 and 150 may be eliminated, and also, the first and second non-conductive films 160 and 150 may be more securely bonded to the connection bumps 170A, 170B, 170C, and 170D. Thus, this recess process may prevent defects from being developed due to overflow of the first and second uncured non-conductive films 160' and 150', and may achieve a secure bond by increasing filling rates of the first and second non-conductive films 160 and 150.

Figure 12:
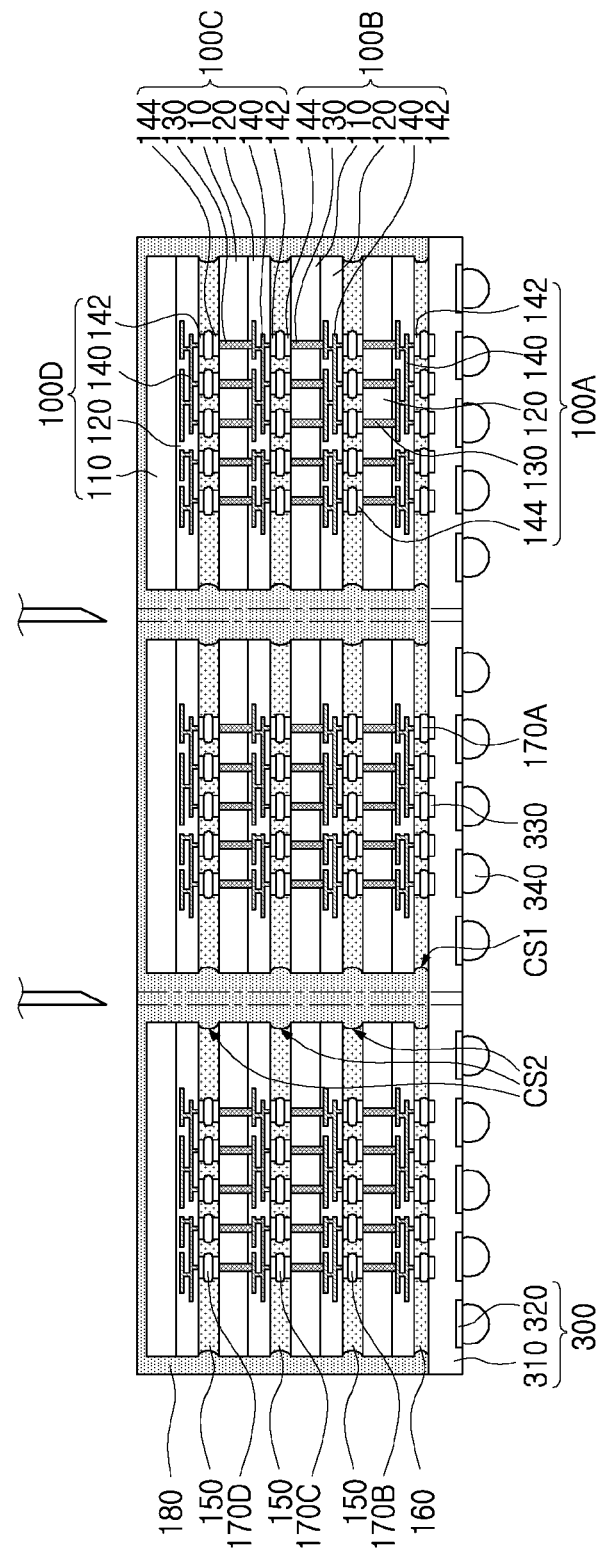

As illustrated in FIG. 12, the molding member 180 may be formed to encapsulate the first to fourth semiconductor chips 100A, 100B, 100C, and 100D, disposed on the base substrate 300.

The molding member 180 may be formed to surround the side surfaces of the semiconductor chips 100A, 100B, 100C, and 100D, and in the present example embodiment, may be formed to cover an upper surface of the semiconductor chip 100D. Further, the molding member 180 may be formed to surround the side surfaces of the first and second non-conductive films 160 and 150. External connection terminals 340 may be next formed on lower surface pads 320 of the base substrate 300. The external connection terminals 340 may electrically connect the semiconductor package to an external device. For example, the external connection terminals 340 may be solder balls or bumps in various shapes.

Subsequently, a cutting process may be conducted (portions denoted by broken lines may be removed) to separate the semiconductor chips 100A, 100B, 100C, and 100D into a semiconductor package 200B illustrated in FIG. 5. Side surfaces of the molding member 180 may have substantially flat coplanar surfaces with side surfaces of the base substrate 300. In the present example embodiment, since the first and second non-conductive films 160 and 150 have concave surfaces CS1 and CS2, the bonding surface between the molding member 180 and the first and second non-conductive films 160 and 150 may be increased, thereby having an increased bond strength therebetween. Accordingly, the reliability of the semiconductor package may be increased.

While the method of manufacturing a semiconductor package 200B has been described in conjunction with FIGS. 9-12, it will be apparent to those skilled in the art that modifications and variations could be made, for example, semiconductor packages 200 and 200A having different structures than the semiconductor package 200B, may be fabricated without departing from the scope of the present inventive concept. For example, the semiconductor packages 200 and 200A illustrated in FIG. 1 and FIG. 4, as described above, may be fabricated in a manner similar to configuring stacks of semiconductor chips by using a separate carrier substrate in place of the base substrate 300.

Figure 13:
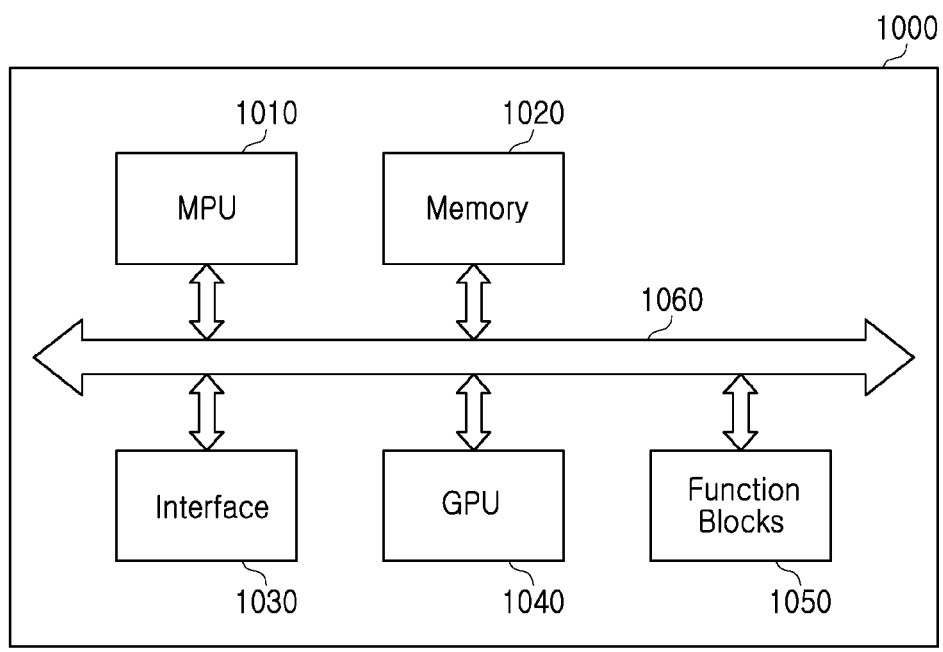
FIG. 13 is a block diagram illustrating a configuration of a semiconductor package according to an example embodiment.

FIG. 13 is a block diagram illustrating a configuration of a semiconductor package according to example embodiments.

As illustrated in FIG. 13, a semiconductor device 1000 may include a microprocessor unit (MPU) 1010, a memory 1020, an interface 1030, a graphics processing unit (GPU) 1040, function blocks 1050, and a bus 1060 connecting the MPU 1010, the memory 1020, the interface 1030, the GPU 1040, and the function blocks 1050. The semiconductor device 1000 may include both the microprocessor unit 1010 and the graphics processing unit 1040, or may include only one of the two.

The microprocessor unit 1010 may include a core and an L2 cache. For example, the microprocessor unit 1010 may include a multi-core. Individual cores of the multi-core may have the same or different performance characteristics from each other. Individual cores of the multi-core may be activated at the same time or may be activated at different points in time from each other.

The memory 1020 may store results or the like processed by the function blocks 1050 under the control of the microprocessor unit 1010. The interface 1030 may send data or signals to or receive data or signals from external devices. The graphics processing unit 1040 may process graphics functions. For example, the graphics processing unit 1040 may perform a video codec or may process 3D graphics. The function blocks may perform various functions. For example, when the semiconductor package 100 is an application processor (AP) used on a mobile device, a portion of the function blocks 1050 may perform a communications function. In particular, the semiconductor device 1000 may include the semiconductor packages 200, 200A, and 200B as described in FIG. 1, FIG. 4, and FIG. 5.

As set forth above, according to example embodiments of the present inventive concept, a space between packages on a base substrate may be reduced while productivity may be increased, by controlling the problem of non-conductive films (NFC) flowing out from between semiconductor chips (or between the base substrate and a semiconductor chip) through a hydrostatic bonding process. Further, reliability of the packages may be increased by improving bond strength between side surfaces of the non-conductive films and an external molding member.

While example embodiments have been shown and described above, it will be apparent to those skilled in the art that modifications and variations could be made without departing from the scope of the present inventive concept, as defined by the appended claims.

What is claimed is:
1. A semiconductor package comprising:
a first semiconductor chip having a first through substrate via (TSV);
a second semiconductor chip stacked on the first semiconductor chip having a second through substrate via, the second through substrate via being connected to the first through substrate via;
a first adhesive layer disposed between the first semiconductor chip and the second semiconductor chip, wherein a side surface of the first adhesive layer is recessed from side surfaces of the first and second semiconductor chips; and a molding member surrounding the side surfaces of the first and second semiconductor chips and the side surface of the first adhesive layer, wherein the side surface of the first adhesive layer has a concave surface.

2. The semiconductor package of claim 1, wherein the molding member is in contact with the side surface of the first adhesive layer.

3. The semiconductor package of claim 1, further comprising:

a heat radiating plate disposed on the second semiconductor chip and the molding member.

4. The semiconductor package of claim 1, further comprising:

a base substrate on which the first semiconductor chip is mounted, wherein the base substrate includes a wiring circuit connected to the first through substrate via of the first semiconductor chip; and a second adhesive layer disposed between the first semiconductor chip and the base substrate, wherein a side surface of the second adhesive layer is recessed from the side surface of the first semiconductor chip.

5. The semiconductor package of claim 4, wherein the first adhesive layer and the second adhesive layer are formed of different materials.

6. The semiconductor package of claim 1, further comprising:

a third semiconductor chip stacked in a direction perpendicular to an upper surface of the second semiconductor chip, and including a third through substrate via electrically connected to the second through substrate via; and a second adhesive layer disposed between the second semiconductor chip and the third semiconductor chip, wherein a side surface of the second adhesive layer is recessed from the side surfaces of the second semiconductor chip and a side surface of the third semiconductor chip.

7. The semiconductor package of claim 1, wherein the first and second semiconductor chips include a memory chip, and the semiconductor package is a high bandwidth memory (HBM) device.

8. A semiconductor package comprising:

a base substrate having a wiring circuit;

a plurality of semiconductor chips stacked in a direction perpendicular to an upper surface of the base substrate;

a first adhesive layer disposed between the base substrate and a lowermost semiconductor chip of the plurality of semiconductor chips, wherein a side surface of the first adhesive layer is recessed from a side surface of the lowermost semiconductor chip; and a plurality of second adhesive layers, each being disposed between corresponding two adjacent semiconductor chips of the plurality of semiconductor chips and having a side surface recessed from side surfaces of the corresponding two adjacent semiconductor chips, wherein side surfaces of the plurality of second adhesive layers have concave surfaces.

9. The semiconductor package of claim 8, wherein the base substrate has a surface area larger than a surface area of each of the plurality of semiconductor chips.

10. The semiconductor package of claim 8, wherein each of the plurality of semiconductor chips has substantially the same surface area.

11. The semiconductor package of claim 8, wherein the first adhesive layer has a thickness smaller than that of each of the plurality of second adhesive layers.

12. The semiconductor package of claim 8, wherein the side surface of the first adhesive layer has a first recessed depth, each of the side surfaces of the plurality of second adhesive layers has a second recessed depth, and the first recessed depth is different from the second recessed depth.

13. The semiconductor package of claim 8, further comprising:

a molding member surrounding the side surfaces of the plurality of semiconductor chips and the side surfaces of the first and second adhesive layers, wherein the molding member is disposed on a portion of the upper surface of the base substrate.

14. A semiconductor package comprising:

first and second semiconductor chips stacked in a vertical direction, each of the first and second semiconductor chips having a semiconductor substrate having a lower surface and an upper surface opposing each other, a semiconductor device layer disposed on the lower surface of the semiconductor substrate, and a through substrate via penetrating the semiconductor substrate and the semiconductor device layer;

an adhesive layer disposed between the first semiconductor chip and the second semiconductor chip, wherein the through substrate via of the first semiconductor chip is connected to the through substrate via of the second semiconductor chip, and a side surface of the adhesive layer is a concave surface recessed from side surfaces of the first and second semiconductor chips; and a molding member surrounding the side surfaces of the first and second semiconductor chips and the concave surface of the adhesive layer.

15. The semiconductor package of claim 14, wherein the adhesive layer has a portion extending on a side surface of at least one of the first and second semiconductor chips.

16. The semiconductor package of claim 14, wherein the molding member is filled in the concave surface of the adhesive layer.

17. The semiconductor package of claim 14, wherein the first semiconductor chip is a logic chip, and the second semiconductor chip is a memory chip.

* * * * *